US 6,621,716 B2

(12) United States Patent
Edwards et al.

(10) Patent No.: US 6,621,716 B2
(45) Date of Patent: Sep. 16, 2003

(54) LED PACKAGE

(75) Inventors: Geoffrey Stephen Edwards, Grange Over Sands (GB); Andrew Leviston Cock, Dalton in Furness (GB)

(73) Assignee: Oxley Developments Company Limited, Cumbria (GB)

(*) Notice: Subject to any disclaimer, the term of this patent is extended or adjusted under 35 U.S.C. 154(b) by 0 days.

(21) Appl. No.: 09/759,393

(22) Filed: Jan. 12, 2001

(65) Prior Publication Data

US 2001/0012200 A1 Aug. 9, 2001

(30) Foreign Application Priority Data

Jan. 12, 2000 (GB) .............................. 0000511

(51) Int. Cl.⁷ ........................ H05K 1/00; H05K 1/11; F21S 4/00
(52) U.S. Cl. .................. 361/803; 361/748; 361/784; 361/806; 362/84; 362/249; 362/362; 362/800
(58) Field of Search ................ 313/315–318, 313/324, 498–512; 315/46–58, 71, 185 R, 185 S, 187, 205, 224–225, 250, 291, 294, 307, 312; 361/803–812, 784, 748; 362/84, 95, 226, 240, 249–254, 311, 362–375, 800, 812

(56) References Cited

U.S. PATENT DOCUMENTS

| 4,211,955 A | * | 7/1980 | Ray ........................... 315/53 |
| 4,358,708 A | * | 11/1982 | Silva .......................... 315/58 |
| 4,630,183 A | * | 12/1986 | Fujita ........................ 362/311 |
| 4,727,289 A | * | 2/1988 | Uchida ........................ 315/71 |
| 4,959,761 A | * | 9/1990 | Critelli et al. ................ 257/99 |
| 5,199,177 A | * | 4/1993 | Hutchins et al. ........... 33/348.2 |
| 5,655,830 A | * | 8/1997 | Ruskouski ................... 362/240 |
| 6,184,628 B1 | * | 2/2001 | Ruthenberg ............ 315/185 R |

* cited by examiner

Primary Examiner—David Martin
Assistant Examiner—Michael L. Lindinger
(74) Attorney, Agent, or Firm—Christie, Parker & Hale, LLP

(57) ABSTRACT

An LED package having a generally tubular electrically conductive body, a circuit board which is mounted across the body at or adjacent one end thereof and which has an outer face on which an LED is mounted, an end contact exposed at the end of the body remote from the circuit board and located relative to the body by means of an insulating cap mounted across the body. An electrical conductor extends from the end contact through the cap, through the interior of the body and through the circuit board to connect the end contact to one of the anode and the cathode of the LED. An electrically conductive path is formed on the circuit board to connect the other of the anode and the cathode of the LED to the body such that the body serves as a second contact enabling current to be supplied to the LED.

6 Claims, 1 Drawing Sheet

LED PACKAGE

CROSS-REFERENCE TO RELATED APPLICATION

This application claims priority of United Kingdom patent Application 0000511.6, filed on Jan. 12, 2000.

BACKGROUND OF THE INVENTION

The present invention is concerned with LED packages, particularly with LED packages which can serve as replacements for filament bulbs.

In many contexts, filament bulbs are being replaced by light emitting diodes (the abbreviation "LED" will be used throughout this document in place of "light emitting diode"). To this end it is frequently necessary to provide an LED package which can be plugged directly into an existing socket intended to receive a filament bulb. Some packages having exterior dimensions and contact arrangements compatible with the existing sockets are known.

However, there is pressure to simplify the construction of such packages for the sake of economy. There are also difficulties in manufacturing small enough LED packages for use in certain contexts, such as replacements for miniature indicator bulbs.

SUMMARY OF THE INVENTION

In accordance with the present invention there is an LED package having a generally tubular electrically conductive body, a circuit board which is mounted across the body at or adjacent one end thereof. The circuit board has an outer face on which an LED is mounted. The LED package also having an end contact exposed at the end of the body remote from the circuit board and located relative to the body by means of an insulating cap mounted across the body. An electrical conductor extends from the end contact through the cap, through the interior of the body and through the circuit board to connect the end contact to one of the anode and the cathode of the LED. An electrically conductive path formed on the circuit board connects the other of the anode and the cathode of the LED to the body, such that the body serves as a second contact enabling current to be supplied to the LED.

This construction makes possible a compact LED package that is straightforward to manufacture. The shape and dimensions of the body and contact may be chosen such that the package can be inserted into existing sockets used for filament bulbs.

It is particularly preferred that the electrical conductor is connected to the LED through a connection pad formed on the circuit board's outer face in a region beneath the LED. This makes possible particularly straightforward assembly of the package.

It is also preferred that the electrical conductor comprises a wire end inserted into a through going, plated hole in the circuit board whereby connection is made through the circuit board. This is constructionally straightforward.

The electrical conductor preferably comprises a resistor disposed within the body and connected between the end contact and the LED. This can serve to limit current through the LED and can be chosen to enable the package to operate at the supply voltage used for filament bulbs.

In alternative embodiments, the resistor can be replaced by, or connected to, an integrated circuit ("IC") or rectifier network. Such embodiments enable closer control of the current. Preferably the IC or rectifier network is chosen to allow the LED package to be operated independently of the polarity of the voltage supply or to be operated on an A.C. voltage dagger.

In an especially preferred embodiment of the present invention, a shoulder is formed in the vicinity of an end of the body and the circuit board is mounted with its inner face against the shoulder, the electrically conductive path from the LED to the body comprising a track on the circuit board leading from a portion of the inner face of the circuit board which lies against the shoulder, via a through-going plated hole in the circuit board to a solder fillet on the circuit board's outer surface, the solder fillet connecting to the LED.

The LED and upper face of the circuit board may be encapsulated by a meniscus lens.

The present invention is particularly well suited to miniature LED packages, typically of the order of 5 to 10 mm in length.

BRIEF DESCRIPTION OF THE DRAWINGS

A specific embodiment of the present invention will now be described, by way of example only, with reference to the accompanying drawings, in which.

DETAILED DESCRIPTION OF THE INVENTION

Figure 1:
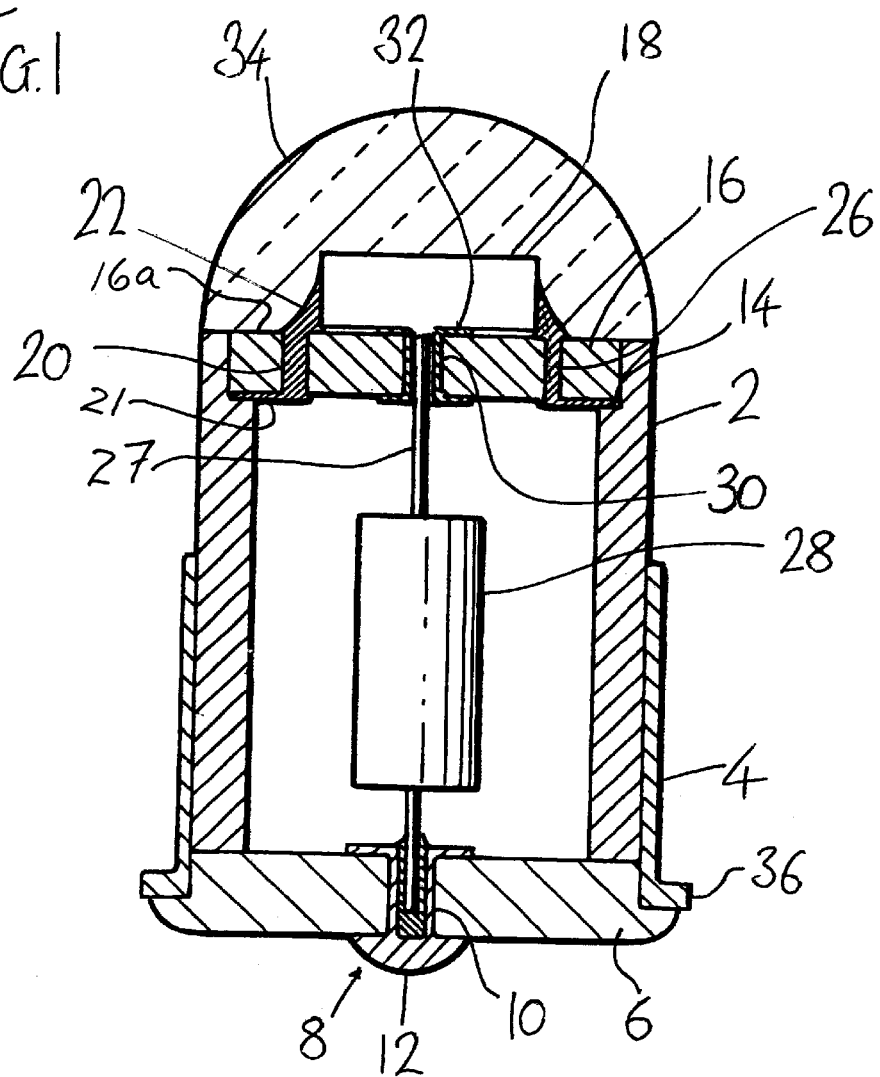
FIG. 1 is an axial section through an LED package embodying the invention.
Figure 2:
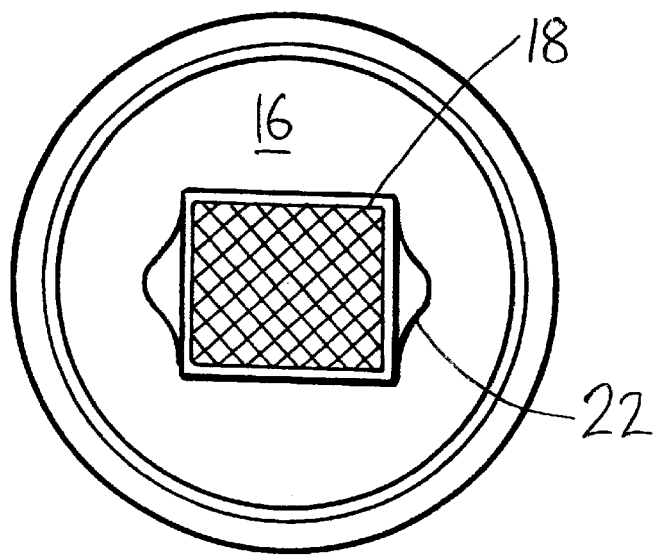
FIG. 2 is a view of the LED package of FIG. 1 from above.

The package comprises a body formed by an inner metal tube 2 partly received in a tubular outer sleeve 4. Formed on the base of the body is an annular cap 6 of insulating plastics material and having a through going axial opening. A generally mushroom shaped metal contact piece 8 is located by the cap 6, stem 10 of the contact piece being received in the cap's axial opening, and so being exposed toward the interior of the housing, while head 12 of the contact piece is exposed at the exterior of the body to serve as a contact. A shoulder formed at the transition between the head 10 and stem 12 abuts the base of the cap 6.

At its upper end, the tube 2 is cut away to form an annular shoulder 14 upon which is mounted a circular printed circuit board ("PCB") 16 bearing the LED 18 on its outer face 16a. The LED is electrically connected to the tube 2 via a plated through going hole 20 formed in the PCB and connected at its lower end by a track 21 formed on the PCB to the tube 2, and connected at its upper end, via a solder fillet 22, to the LED 18. The LED is secured to the PCB by glue. In the illustrated embodiment there is a further connection between the tube 2 and the LED, formed via a second through going hole 26 in the PCB. This further connection to the tube is optional.

The circuit to the LED is completed via an electrical conductor 27 containing a current limiting resistor 28 which is contained in the tube 2. The electrical conductor being connected between and soldered to the contact piece 8 and a further plated through going hole 30 formed through the PCB in a region thereof beneath the LED 18, whereby a connection to the LED is formed via a contact pad 32 on the PCB's upper (outer) surface.

The LED and PCB are encapsulated by a meniscus lens 34 formed in the illustrated embodiment from transparent epoxy.

In use, the LED can be inserted in sockets used for conventional filament bulbs, one connection being formed to the contact piece 8 and another being formed to the exterior of the sleeve 4. A projecting rim 36 extending around the sleeve aids engagement with the socket.

The length of the illustrated package is preferably substantially 8 mm.

What is claimed is:

1. An LED package comprising a tubular electrically conductive body having proximal and distal ends and a circuit board, the perimeter of the proximal end of the body being cut away to form an annular shoulder in which a peripheral portion of the circuit board is received and seated, thereby mounting the circuit board across the proximal end of the body, the circuit board having an outer face directed away from the interior of the body on which an LED is mounted, the package further comprising an end contact exposed at the distal end of the body and located relative to the body by means of an insulating cap mounted across the distal end of the body, an electrical conductor extending from the end contact through the cap, through the interior of the body and through a through-going, plated hole in the circuit board to connect the end contact to one of an anode and cathode of the LED, and a track formed on the circuit board which extends from a connection to the other of the anode and the cathode of the LED to the periphery of the circuit board, the track thereby making contact with the shoulder of the body and the body serving as a second contact enabling current to be supplied to the LED.

2. An LED package according to claim 1, wherein the electrical conductor is connected to the LED through a contact pad formed on the outer face of the circuit board in a region beneath the LED.

3. An LED package according to claim 2, wherein the electrical conductor comprises a wire end inserted into the through-going, plated hole in the circuit board whereby connection is made through the circuit board.

4. An LED package according to claim 3, wherein the track extends from a portion of an inner face of the circuit board which lies against the shoulder, via the through-going plated hole in the circuit board to a solder fillet on the circuit board's outer surface, the solder fillet connecting to the LED.

5. An LED package according to claim 4 wherein the LED and outer surface of the circuit board are encapsulated by a meniscus lens.

6. An LED package according to claim 3, wherein the electrical conductor comprises a resistor disposed within the body and connected between the end contact and the LED.

* * * * *